(12) United States Patent
Cao et al.

(10) Patent No.: US 10,566,354 B2
(45) Date of Patent: Feb. 18, 2020

(54) ARRAY SUBSTRATE, TOUCH DISPLAY SCREEN AND MANUFACTURING METHOD OF ARRAY SUBSTRATE

(71) Applicant: Wuhan China Star Optoelectronics Technology Co., Ltd., Wuhan, Hubei (CN)

(72) Inventors: Zhihao Cao, Guangdong (CN); Xiaohui Nie, Guangdong (CN); Zhandong Zhang, Guangdong (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 14 days.

(21) Appl. No.: 16/040,636

(22) Filed: Jul. 20, 2018

(65) Prior Publication Data

US 2019/0267401 A1    Aug. 29, 2019

Related U.S. Application Data

(63) Continuation of application No. PCT/CN2018/082799, filed on Apr. 12, 2018.

(30) Foreign Application Priority Data

Feb. 26, 2018   (CN) .......................... 2018 1 0160028

(51) Int. Cl.
  *G06F 3/045*   (2006.01)
  *H01L 27/12*   (2006.01)
  (Continued)

(52) U.S. Cl.
  CPC ............ *H01L 27/124* (2013.01); *G06F 3/044* (2013.01); *G06F 3/0412* (2013.01);
  (Continued)

(58) Field of Classification Search
  CPC .. G06F 3/044; G02F 1/1343; G02F 1/134318; G02F 1/1362; H01L 21/12;
  (Continued)

(56) References Cited

U.S. PATENT DOCUMENTS 10,181,484 B2 *   1/2019   Zhang ................. H01L 27/1296
2002/0195604 A1 *  12/2002   Segawa ............. G02F 1/136227
                                                257/72

(Continued)

FOREIGN PATENT DOCUMENTS

| CN | 1991480 A | 7/2007 |
| CN | 104332473 A | 2/2015 |
| CN | 106653770 A | 5/2017 |

OTHER PUBLICATIONS

Translation of Chinese Publication No. CN 106635770 A (specification and claims) total 7 pages, May 10, 2017.*

(Continued)

*Primary Examiner* — Joe H Cheng
(74) *Attorney, Agent, or Firm* — Leong C. Lei

(57) ABSTRACT

An array substrate used for a touch display screen is provided. The array substrate comprises a substrate; a polysilicon layer disposed on the substrate; a dielectric layer disposed on the polysilicon layer and the substrate; a touch line, a connecting line and data line arranged sequentially at intervals on the dielectric layer; a planarization layer covering the connecting line and data line; wherein a first through-hole and second through-hole arranged sequentially at intervals are formed on planarization layer, the touch line is facing and exposed from first through-hole; a portion of the connecting line is facing and exposed from second through-hole; a source and drain in contact with a portion of the surface of polysilicon layer are formed in dielectric layer arranged at intervals, the drain and source are respectively (Continued)

connected with the connecting line and data line, and the first through-hole is completely misplaced with the second through-hole.

14 Claims, 3 Drawing Sheets

(51) Int. Cl.
 G06F 3/044 (2006.01)
 H01L 29/786 (2006.01)
 H01L 29/66 (2006.01)
 G06F 3/041 (2006.01)
(52) U.S. Cl.
 CPC ........ G06F 3/0443 (2019.05); G06F 3/04164 (2019.05); H01L 27/1222 (2013.01); H01L 27/1248 (2013.01); H01L 27/1262 (2013.01); H01L 29/66757 (2013.01); H01L 29/78675 (2013.01); G06F 2203/04103 (2013.01)
(58) Field of Classification Search
 CPC ............... H01L 21/1222; H01L 21/124; H01L 21/1248; H01L 21/1262; H01L 21/127; H01L 29/66; H01L 29/66757; H01L 29/78675
 See application file for complete search history.

(56) References Cited

U.S. PATENT DOCUMENTS

| | | | | |
|---|---|---|---|---|
| 2005/0036080 | A1* | 2/2005 | Koide | H01L 27/12 349/43 |
| 2007/0138951 | A1* | 6/2007 | Park | H01L 27/144 313/504 |
| 2010/0039600 | A1* | 2/2010 | Ishige | G02F 1/1345 349/139 |
| 2012/0120616 | A1* | 5/2012 | Katsui | G02F 1/136286 361/748 |
| 2014/0239270 | A1* | 8/2014 | Ko | H01L 27/1255 257/40 |
| 2014/0353605 | A1* | 12/2014 | Kim | H01L 27/124 257/40 |
| 2015/0194443 | A1* | 7/2015 | Chen | H01L 27/1248 257/72 |
| 2016/0149161 | A1* | 5/2016 | Lee | H01L 51/5271 257/40 |
| 2016/0181346 | A1* | 6/2016 | Kwon | H01L 27/3276 257/40 |
| 2016/0254338 | A1* | 9/2016 | Lin | H01L 27/3272 257/40 |
| 2016/0300866 | A1* | 10/2016 | Long | H01L 21/77 |
| 2017/0365622 | A1* | 12/2017 | Yuan | H01L 27/124 |
| 2018/0294293 | A1* | 10/2018 | Zhang | H01L 27/1296 |
| 2018/0315357 | A1* | 11/2018 | Nam | G09F 13/22 |
| 2019/0006521 | A1* | 1/2019 | Noh | H01L 29/41733 |
| 2019/0064568 | A1* | 2/2019 | Zheng | G02F 1/13338 |

OTHER PUBLICATIONS

International search report dated Oct. 30, 2018 from corresponding application No. PCT/CN2018/082799.

* cited by examiner

ARRAY SUBSTRATE, TOUCH DISPLAY SCREEN AND MANUFACTURING METHOD OF ARRAY SUBSTRATE

RELATED APPLICATION

The present application is a continuation application of POT Patent Application No. PCT/CN2018/082799 filed on Apr. 12, 2018, which claims the priority benefit of Chinese Patent Application No. 201810160028.X, entitled "array substrate, touch display screen and manufacturing method of array substrate", filed on Feb. 26, 2018, which is herein incorporated by reference in its entirety.

FIELD OF THE INVENTION

The present disclosure relates to a display field, in particular to an array substrate, a touch display screen and a manufacturing method of an array substrate.

BACKGROUND OF THE INVENTION

Touch functions are usually achieved by touch lines in the touch display field, but the touch lines need to pass through via-holes of a planarization layer to ensure the connection with electrodes, and the purpose of signal transmission through touch lines is mainly achieved by forming holes in the planarization layer under the existing design. However, in the case of a product of smaller size, the simultaneous presence of via-holes of a planarization layer probably leads that the distance between two via-holes of the planarization layer is too small and two adjacent via-holes of the planarization layer merge into a large via-hole, thereby causing uneven display and reducing the yield of the product

SUMMARY OF THE INVENTION

The object of the present disclosure is to provide an array substrate, a touch display screen and a manufacturing method of an array substrate, thereby reducing the probability of uneven display of a touch display screen and improving the yield of a product.

The present disclosure provides an array substrate used for a touch display screen, wherein the array substrate comprises
  a substrate,
  a polysilicon layer disposed on the substrate,
  a dielectric layer disposed on the polysilicon layer and the substrate,
  a touch line, a connecting line and a data line arranged sequentially at intervals on the dielectric layer, the touch line,
  a planarization layer covering the connecting line and the data line;
  wherein a first through-hole and a second through-hole arranged sequentially at intervals are formed on the planarization layer; the touch line is facing and exposed from the first through-hole; a portion of the connecting line is facing and exposed from the second through-hole;
  a source and a drain, which are in contact with a portion of the surface of the polysilicon layer, are formed in the dielectric layer arranged at intervals; the drain is connected with the connecting line; the source is connected with the data line, and the first through-hole is completely misplaced with the second through-hole The array substrate disclosed herein may further comprise a gate; the dielectric layer comprises a first dielectric layer and a second dielectric layer stacked on the first dielectric layer; the polysilicon layer is formed on the substrate and covered by the first dielectric layer, and the gate is formed on the first dielectric layer and covered by the second dielectric layer.

The array substrate disclosed herein may further comprise a common electrode layer disposed on the planarization layer, and the common electrode layer is connected with the touch line through the first through-hole.

The array substrate disclosed herein may further comprise a passivation layer, and the common electrode layer and the side wall of the second through-hole are covered by the passivation layer.

The array substrate disclosed herein may further comprise a pixel electrode layer, and the pixel electrode layer is disposed on the passivation layer and connected with the connecting line through the second through-hole.

The present disclosure further provides a touch display screen, and the touch display screen comprises the array substrates as described above.

The present disclosure further provides a manufacturing method of an array substrate comprising:
  providing a substrate;
  forming a polysilicon layer on the substrate;
  forming a dielectric layer covering the polysilicon layer on the polysilicon layer, wherein the dielectric layer comprises a first dielectric layer and a second dielectric layer stacked on the first dielectric layer;
  forming a source and a drain in contact with a portion of the surface of the polysilicon layer in the dielectric layer arranged at intervals;
  forming a touch line, a connecting line and a data line on the dielectric layer arranged sequentially at intervals, wherein the drain is connected with the connecting line and the source is connected with the data line;
  covering a planarization layer on the touch line, the connecting line and the data line and forming a first through-hole and a second through-hole on the planarization layer arranged sequentially at intervals; wherein the touch line is facing and exposed from the first through-hole; a portion of the connecting line is facing and exposed from the second through-hole; and the first through-hole is completely misplaced with the second through-hole.

The step of forming a dielectric layer covering the polysilicon layer on the polysilicon layer disclosed herein may further comprise:
  forming the polysilicon layer on the substrate;
  forming the first dielectric layer covering the polysilicon layer on the polysilicon layer;
  forming a gate on the first dielectric layer;
  forming the second dielectric layer covering the gate on the gate.

The step of forming a source and a drain in contact with a portion of the surface of the polysilicon layer in the dielectric layer arranged at intervals disclosed herein may further comprise: forming two spaced third through-holes in the dielectric layer, and the source and the drain are formed in the third through-holes.

After covering a planarization layer on the touch line, the connecting line and the data line and forming a first through-hole and a second through-hole on the planarization layer arranged sequentially at intervals, the manufacturing method disclosed herein may further comprise:
  forming a common electrode layer on the planarization layer, wherein the common electrode layer is connected with the touch line through the first through-hole;

forming a passivation layer covering the common electrode layer and the side wall of the second through-hole on the common electrode layer;

forming a pixel electrode layer on the passivation layer, wherein the pixel electrode layer is connected with the connecting line through the second through-hole.

In summary, the first through-hole is completely misplaced with the second through-hole in the present disclosure, which realizes that the distance between the first through-hole and the second through-hole is increased and the probability of merging the first through-hole with the second through-hole is reduced, thereby effectively avoiding the risk of uneven display caused by small distance between the first through-hole and the second through-hole, and improving the performance of the touch display screen and the yield of the product. According to the present disclosure, the ouch line, the connecting line and the data line are arranged at intervals on the dielectric layer, which requires only one photomask for photolithography to obtain the touch line, the connecting line and the data line, and avoids the use of the traditional photoetching method that requires at least two masks to obtain the touch line, thereby simplifying the preparation of an array substrate, reducing production costs, improving the production efficiency, and improving the yield of the product.

BRIEF DESCRIPTION OF THE DRAWINGS

In order to illustrate implementations of present disclosure or the technical solutions of other implementations more clearly, the drawings according to the implementations of present disclosure or the drawings according to the other implementations will be introduced briefly. Apparently, hereinafter described drawings are merely a portion of implementations of present disclosure. For those skilled in the art, they can obtain other drawings on the base of these drawings without creative work.

DETAILED DESCRIPTION OF THE INVENTION

Figure 1:
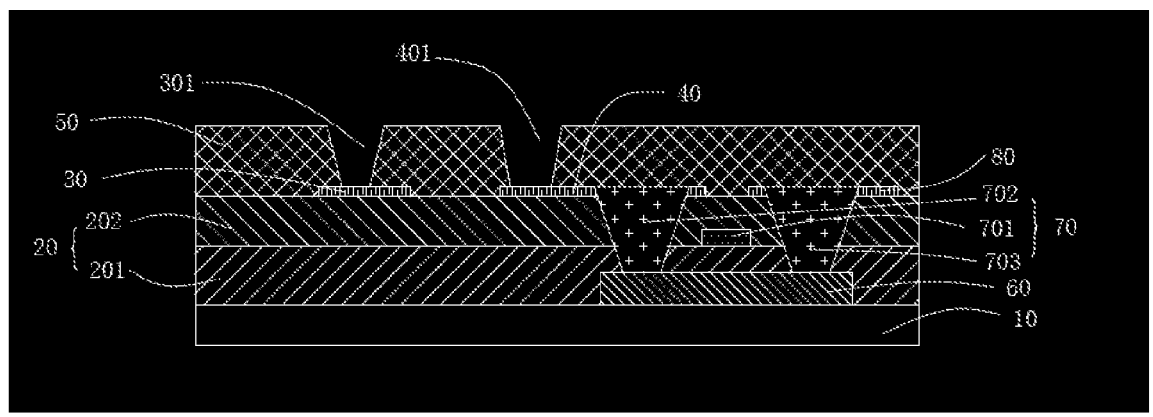
FIG. 1 is a schematic sectional view of certain components of an array substrate provided by implementations of the present disclosure.
Figure 2:
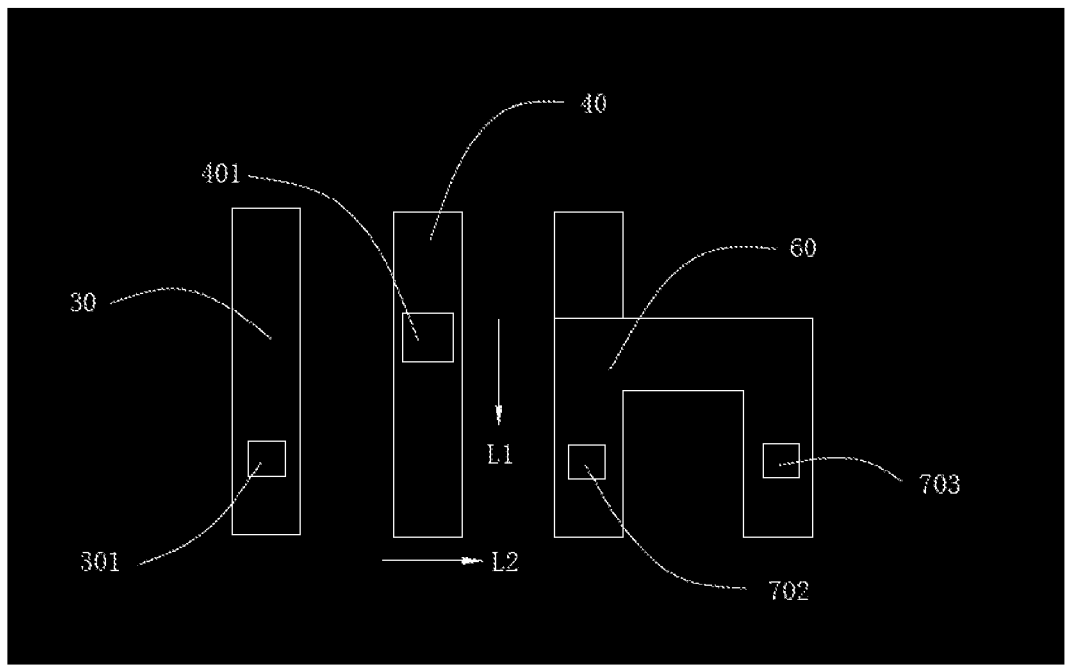
FIG. 2 is a plan view perspective diagram of a touch line, a connecting line, a data line and a polysilicon layer in the array substrate shown in FIG. 1.

See FIG. 1 and FIG. 2. The present disclosure provides an array substrate used for a touch display screen, wherein the array substrate comprises a substrate 10; a polysilicon layer 60 disposed on the substrate 10; a dielectric layer 20 disposed on the polysilicon layer 60 and the substrate 10; a touch line 30, a connecting line 40 and a data line 80 arranged sequentially at intervals on the dielectric layer 20; a planarization layer 50 covering the touch line 30, the connecting line 40 and the data line 80, wherein a first through-hole 301 and a second through-hole 401 arranged sequentially at intervals are formed on the planarization layer 50; the touch line 30 is facing and exposed from the first through-hole 301; a portion of the connecting line 40 is facing and exposed from the second through-hole 401; a source 703 and a drain 702, which are in contact with a portion of the surface of the polysilicon layer 60, are formed in the dielectric layer 20 arranged at intervals; the drain 702 is connected with the connecting line 40; the source 703 is connected with the data line 80, and the first through-hole 301 is completely misplaced with the second through-hole 401.

The first through-hole 301 is completely misplaced with the second through-hole 401 in the present disclosure, which realizes that the distance between the first through-hole 301 and the second through-hole 401 is increased and the probability of merging the first through-hole 301 with the second through-hole 401 is reduced, thereby effectively avoiding the risk of uneven display caused by small distance between the first through-hole 301 and the second through-hole 401, and improving the performance of the touch display screen and the yield of the product.

According to the present disclosure, the ouch line, the touch line 30, the connecting line 40 and the data line 80 are arranged at intervals on the dielectric layer 20, which requires only one photomask for photolithography to obtain the touch line 30, the connecting line 40 and the data line 80, and avoids the use of the traditional photoetching method that requires at least two masks to obtain the touch line 3, thereby simplifying the preparation of an array substrate, reducing production costs, improving the production efficiency, and improving the yield of a product.

For the convenience of description, the extension direction of the touch line 30 is defined as a first direction L1, and the direction perpendicular to the first direction L1 is defined as a second direction L2. Specifically, the first through-hole 301 is formed on the planarization layer 50 and extends to the surface of the touch line 30, the second through-hole 401 is formed on the planarization layer 50 and extends to the surface of the connecting line 40, the center of the first through-hole 301 and the center of the second hole 401 are not on the straight line of the second direction L2 at the same time, and the first through-hole 301 is completely misplaced with the second through-hole 401. The specific location of the first through-hole 301 on the touch line 30 and the specific location of the second through-hole 401 on the connecting line 40 are not limited in the present disclosure so long as the first through-hole 301 is completely misplaced with the second through-hole 401. In the implementation, the array substrate comprises a thin film transistor 70, the thin film transistor 70 comprises the source 703 and the drain 702, the drain 702 is near the second through-hole 401, and the two ends of the drain 702 are connected with the polysilicon layer 60 and the connecting line 40 respectively, the drain 703 is far away from the second through-hole 401 and the two ends of the source 703 are connected with the polysilicon layer 60 and the data line 80, respectively.

Thin film transistor 70 further comprises a gate 701, the dielectric layer 20 comprises a first dielectric layer 201 and a second dielectric layer 202 stacked on the first dielectric layer 201, the polysilicon layer 60 is formed on the substrate 10 and covered by the first dielectric layer 201, and the gate 701 is formed on the first dielectric layer 201 and covered by the second dielectric layer 202. In the implementation, the gate 701 is formed between the source 703 and the drain 702.

Figure 3:
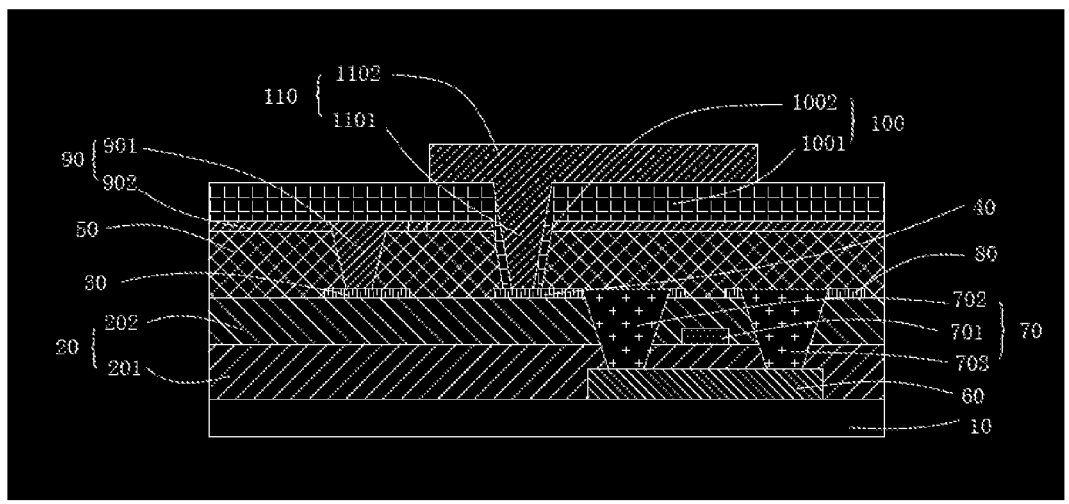
FIG. 3 is a schematic sectional view illustrating the array substrate shown in FIG. 1 having a planarization layer, a common electrode layer, a passivation layer and a pixel electrode layer.

See FIG. 3. The array substrate further comprises a common electrode layer 90 disposed on the planarization layer 50, and the common electrode layer 90 is connected with the touch line 30 through the first through-hole 301. Specifically, the common electrode layer 90 comprises a first common electrode 901 and a second common electrode 902 connected with the first common electrode 901, and the first common electrode 901 is filled in the first through-hole 301 and connected with the touch line 30, and the planarization layer is covered by the second common electrode 902.

The array substrate further comprises a passivation layer 100, and the common electrode layer 90 and the side wall of the second through-hole 401 are covered by the passivation layer 100. Specifically, the passivation layer 100 is an organic film. The passivation layer 100 comprises a first passivation sublayer 1001 and a second passivation sublayer 1002 connected with the first passivation sublayer 1001, the second common electrode 902 is covered by the first passivation sublayer 1001, and the second passivation sublayer 1002 is fitted to the sides of the common electrode layer 90 and the flat layer 50 and extends into the second through-hole 401. That is to say, the second passivation sublayer 1002 is fitted to the side wall of the second through-hole 401 and is connected with part of bottom wall of the second through-hole 401.

The array substrate further comprises a pixel electrode layer 110, and the pixel electrode layer 110 is disposed on the passivation layer 100 and connected with the connecting line 40 through the second through-hole 401. Specifically, the pixel electrode layer 110 comprises a first sub-pixel electrode 1101 and a second sub-pixel electrode 1102 connected with the first sub-pixel electrode 1101, the first sub-pixel electrode 1101 extends into the second through-hole 401 and is connected with the connecting line 40, and the second sub-pixel electrode 1102 is disposed between the first sub-pixel electrode 1101 and the side wall of the second through-hole 401. In the implementation, a projection of the second through-hole 401 on the substrate 10 is misplaced with those of the source 703 and the drain 702 on the substrate 10. The drain is connected with the pixel electrode layer 110 through the connecting line 40. Since a projection of the second through-hole 401 on the substrate 10 is misplaced with those of the source 703 and the drain 702 on the substrate 10, the drain 702 and the pixel electrode layer 110 need to be connected through the connecting line 40, and the connection of the connecting line 40 improves the electrical connection between the drain 702 and the pixel electrode layer 110. Therefore, the stability of the array substrate is improved because of the misplacement between a projection of the second through-hole 401 on the substrate 10 and those of the source 703 and the drain 702 on the substrate 10. The misplacement between a projection of the second through-hole 401 on the substrate 10 and those of the source 703 and the drain 702 on the substrate 10 can be partial or complete misplacement.

The present disclosure provides a touch display screen, and the touch display screen comprises the array substrates as described above. The touch display screen of the present disclosure realizes that the distance between the first through-hole 301 and the second through-hole 401 is increased and the probability of merging the first through-hole 301 with the second through-hole 401 is reduced, thereby effectively avoiding the risk of uneven display caused by small distance between the first through-hole 301 and the second through-hole 401, and improving the performance of the touch display screen and the yield of the product. According to the present disclosure, the ouch line, the touch line 30, the connecting line 40 and the data line 80 are arranged at intervals on the dielectric layer 20, which requires only one photomask for photolithography to obtain the touch line 30, the connecting line 40 and the data line 80, and avoids the use of the traditional photoetching method that requires at least two masks to obtain the touch line 30, thereby simplifying the preparation of an array substrate, reducing production costs, improving the production efficiency, and improving the yield of a product.

Figure 4:
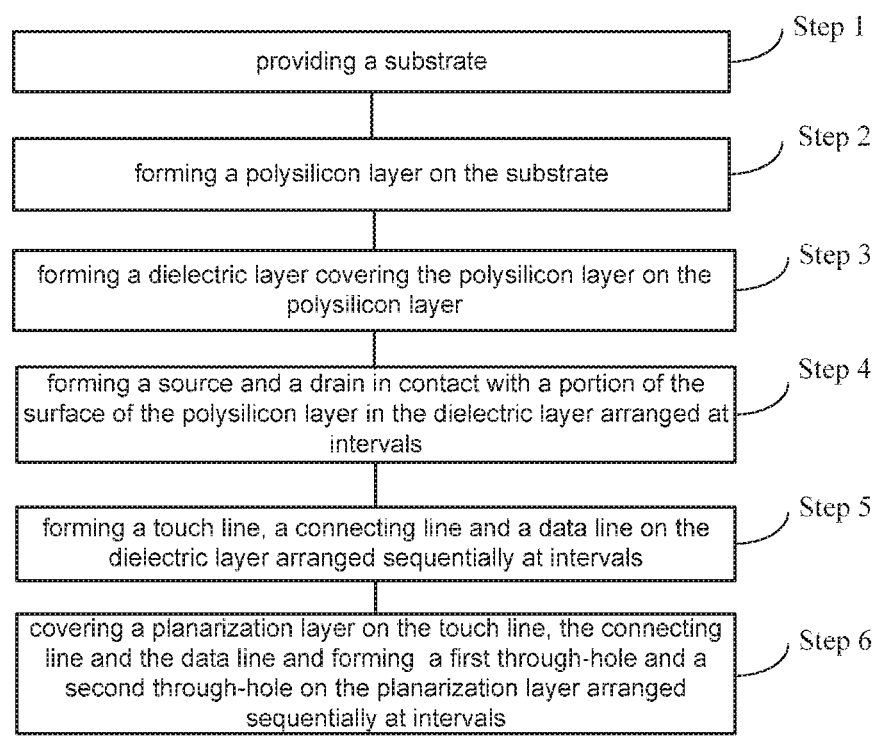
FIG. 4 is a schematic diagram illustrating the process of manufacturing an array substrate provided by the present disclosure.

See FIG. 4. The present disclosure provides a manufacturing method of an array substrate, and the manufacturing method comprises following step 1, step 2, step 3, step 4, step 5 and step 6.

At step 1, a substrate 10 is provided.

At step 2, a polysilicon layer 60 is formed on the substrate.

At step 3, a dielectric layer 20 covering the polysilicon layer 60 is formed on the polysilicon layer 60, wherein the dielectric layer 20 comprises a first dielectric layer 201 and a second dielectric layer 202 stacked on the first dielectric layer 201.

Further, the step of forming a dielectric layer covering the polysilicon layer on the polysilicon layer further comprises:
forming the polysilicon layer 60 on the substrate 10;
forming the first dielectric layer 201 covering the polysilicon layer 60 on the polysilicon layer 60;
forming a gate 701 on the first dielectric layer 201;
forming the second dielectric layer 202 covering the gate 701 on the gate 701.

At step 4, a source 703 and a drain 702 in contact with a portion of the surface of the polysilicon layer 60 are formed in the dielectric layer 20 arranged at intervals.

Further, the step 4 further comprises: forming two spaced third through-holes in the dielectric layer 20, and the source 703 and the drain 702 are formed in the third through-holes.

At step 5, a touch line 30, a connecting line 40 and a data line 80 are formed on the dielectric layer 20 arranged sequentially at intervals, wherein the drain 702 is connected with the connecting line 40 and the source 703 is connected with the data line 80.

At step 6, a planarization layer 50 is covered on the touch line 30, the connecting line 40 and the data line 80; a first through-hole 301 and a second through-hole 401 are formed on the planarization layer 50 arranged sequentially at intervals; wherein the touch line 30 is facing and exposed from the first through-hole 301; a portion of the connecting line 40 is facing and exposed from the second through-hole 401, and the first through-hole 301 is completely misplaced with the second through-hole 401.

In this step, a projection of the second through-hole 401 on the substrate 10 is misplaced with those of the source 703 and the drain 702 on the substrate 10. That is to say, a projection of the second through-hole 401 on the substrate 10 is misplaced with those of the third second through-holes. The connection between the second through-hole 401 and the third through-hole through the connecting line 40 is achieved by the misplacement between the second through-hole 401 and the third through-holes, thus improving the electrical connection between materials in the second hole 401 and materials in the third through-hole and improving the stability of the array substrate.

Further, after covering a planarization layer 50 on the touch line 30, the connecting line 40 and the data line 80 and forming a first through-hole 301 and a second through-hole 401 on the planarization layer 50 arranged sequentially at intervals, the manufacturing method further comprises:
forming a common electrode layer 90 on the planarization layer 50, wherein the common electrode layer 90 is connected with the touch line 30 through the first through-hole 301;

forming a passivation layer 100 covering the common electrode layer 90 and the side wall of the second through-hole 401 on the common electrode layer 90;

forming a pixel electrode layer 110 on the passivation layer 100, wherein the pixel electrode layer 110 is connected with the connecting line 40 through the second through-hole 410.

The above disclosure is merely preferred implementations of the present disclosure, but the disclosure is not to be construed as being limited thereto. Those skilled in the art can understand all or part of the process of implementing the above implementations and equivalent changes made to the implementations in accordance with the claim of the present disclosure shall be covered within the scope of the present disclosure.

What is claimed is:

1. An array substrate used for a touch display screen, wherein the array substrate comprises a substrate;
    a polysilicon layer disposed on the substrate;
    a dielectric layer disposed on the polysilicon layer and the substrate;
    a touch line, a connecting line and a data line arranged sequentially at intervals on the dielectric layer;
    a planarization layer covering the connecting line and the data line;
    wherein a first through-hole and a second through-hole arranged sequentially at intervals are formed on the planarization layer; the touch line is facing and exposed from the first through-hole; a portion of the connecting line is facing and exposed from the second through-hole;
    a source and a drain, which are in contact with a portion of the surface of the polysilicon layer, are formed in the dielectric layer arranged at intervals; the drain is connected with the connecting line; the source is connected with the data line, and the first through-hole is completely misplaced with the second through-hole.

2. The array substrate as claimed in claim 1, wherein the array substrate further comprises a gate; the dielectric layer comprises a first dielectric layer and a second dielectric layer stacked on the first dielectric layer; the polysilicon layer is formed on the substrate and covered by the first dielectric layer, and the gate is formed on the first dielectric layer and covered by the second dielectric layer.

3. The array substrate as claimed in claim 2, wherein the array substrate further comprises a common electrode layer disposed on the planarization layer, and the common electrode layer is connected with the touch line through the first through-hole.

4. The array substrate as claimed in claim 3, wherein the array substrate further comprises a passivation layer, and the common electrode layer and the side wall of the second through-hole are covered by the passivation layer.

5. The array substrate as claimed in claim 4, wherein the array substrate further comprises a pixel electrode layer, and the pixel electrode layer is disposed on the passivation layer and connected with the connecting line through the second through-hole.

6. A touch display screen, wherein the touch display screen comprises the array substrates as claimed in claim 1.

7. The touch display screen as claimed in claim 6, wherein the array substrate further comprises a gate; the dielectric layer comprises a first dielectric layer and a second dielectric layer stacked on the first dielectric layer; the polysilicon layer is formed on the substrate and covered by the first dielectric layer, and the gate is formed on the first dielectric layer and covered by the second dielectric layer.

8. The touch display screen as claimed in claim 7, wherein the array substrate further comprises a common electrode layer disposed on the planarization layer, and the common electrode layer is connected with the touch line through the first through-hole.

9. The touch display screen as claimed in claim 8, wherein the array substrate further comprises a passivation layer, and the common electrode layer and the side wall of the second through-hole are covered by the passivation layer.

10. The touch display screen as claimed in claim 9, wherein the array substrate further comprises a pixel electrode layer, and the pixel electrode layer is disposed on the passivation layer and connected with the connecting line through the second through-hole.

11. A manufacturing method of an array substrate, wherein the manufacturing method of an array substrate comprises:
    providing a substrate;
    forming a polysilicon layer on the substrate;
    forming a dielectric layer covering the polysilicon layer on the polysilicon layer, wherein the dielectric layer comprises a first dielectric layer and a second dielectric layer stacked on the first dielectric layer;
    forming a source and a drain in contact with a portion of the surface of the polysilicon layer in the dielectric layer arranged at intervals;
    forming a touch line, a connecting line and a data line on the dielectric layer arranged sequentially at intervals, wherein the drain is connected with the connecting line and the source is connected with the data line;
    covering a planarization layer on the touch line, the connecting line and the data line and forming a first through-hole and a second through-hole on the planarization layer arranged sequentially at intervals; wherein the touch line is facing and exposed from the first through-hole; a portion of the connecting line is facing and exposed from the second through-hole; and the first through-hole is completely misplaced with the second through-hole.

12. The manufacturing method of the array substrate as claimed in claim 11, wherein the step of forming a dielectric layer covering the polysilicon layer on the polysilicon layer further comprises:
    forming a gate on the first dielectric layer;
    forming the second dielectric layer covering the gate on the gate.

13. The manufacturing method of the array substrate as claimed in claim 12, wherein the step of forming a source and a drain in contact with a portion of the surface of the polysilicon layer in the dielectric layer arranged at intervals further comprises: forming two spaced third through-holes in the dielectric layer, and the source and the drain are formed in the third through-holes.

14. The manufacturing method of the array substrate as claimed in claim 13, after covering a planarization layer on the touch line, the connecting line and the data line and forming a first through-hole and a second through-hole on the planarization layer arranged sequentially at intervals, wherein the manufacturing method further comprises:
    forming a common electrode layer on the planarization layer, wherein the common electrode layer is connected with the touch line through the first through-hole;
    forming a passivation layer covering the common electrode layer and the side wall of the second through-hole on the common electrode layer;

forming a pixel electrode layer on the passivation layer, wherein the pixel electrode layer is connected with the connecting line through the second through-hole.

\* \* \* \* \*